(12) United States Patent
Baker et al.

(10) Patent No.: US 6,420,274 B1
(45) Date of Patent: Jul. 16, 2002

(54) METHOD FOR CONDITIONING PROCESS CHAMBERS

(75) Inventors: John M. Baker, Yorktown Heights, NY (US); Marc Waine Cantell, Sheldon; Paul Wiliam Pastel, Essex, both of VT (US); Alejandro Gabriel Schrott, New York; Ying Zhang, Yorktown Heights, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/567,705

(22) Filed: May 10, 2000

(51) Int. Cl.$^7$ ............................................... H01L 21/00
(52) U.S. Cl. ...................................... 438/706; 438/800
(58) Field of Search ................................. 438/689, 706, 438/707, 710, 800; 427/401, 444, 445; 216/2, 58, 59, 60

(56) References Cited

U.S. PATENT DOCUMENTS 5,546,890 A * 8/1996 Tamaki et al. ............... 117/102

FOREIGN PATENT DOCUMENTS

JP 4-157161 * 5/1992

* cited by examiner

Primary Examiner—Michael J. Sherry
Assistant Examiner—Evan Pert
(74) Attorney, Agent, or Firm—Robert M. Trepp

(57) ABSTRACT

A method for conditioning the inside walls of a process chamber is described incorporating a selected process gas such as Br, $Br_2$, HBr, $Cl_2$, HCl, $F_2$, $SiF_x$, and $NF_3$, a pressure controller, and a timer for soaking the chamber. The invention overcomes the problem of running dummy product wafers to condition the chamber.

6 Claims, 7 Drawing Sheets

METHOD FOR CONDITIONING PROCESS CHAMBERS

FIELD OF THE INVENTION

This invention relates to reducing the time and cost of conditioning semiconductor process chambers operating at low pressures and more particularly to conditioning the surfaces or walls of a chamber with respect to adsorbed molecules, molecular fragments and/or atoms thereon.

BACKGROUND OF THE INVENTION

As semiconductor microelectronics device feature sizes shrink to deep-sub micron dimensions, the new generation etch tools for semiconductor manufacturing will be operating in a high plasma density and low pressure regime. At low pressure, e.g. below 20 mTorr., the effects of gas interactions with the chamber side walls take on an increased importance in affecting the chemistry in the vicinity of a wafer being etched when compared to older generation tools that typically operate above 50 mTorr. and at a lower plasma density. These wall interactions include adsorption, collisions of energetic species, heterogeneous surface reactions, and desorption. With decreasing pressure, the concentration of the reactant species decreases while molecules, molecular fragments and/or atoms coming from the walls have greater access to the region of the wafer and the wafer itself due to the increased mean-free path between molecular and/or atomic collisions. Thus slowly desorbing molecular and atomic species from previous processing or new species resulting from chemical interactions on the chamber walls can have an increased influence on the wafer etching process.

To achieve a repeatable plasma process, the chamber wall conditions have to be kept to as close to an equilibrium state as possible. The conventional method for doing this is to periodically condition the plasma chamber in place of a production run, either after scheduled plasma clean procedures (between every few process runs up to a few days of process runs), after manual wet cleans, or after switching between processes using different chemistries.

The chamber cleaning process is designed to remove the chemical components from the previous process or to clean the residual film deposited on the inside walls of the chamber. For example, for a typical polysilicon or silicide gate etch process, this cleaning step involves running a plasma discharge with a mixture of $Cl_2$, $NF_3$, and $O_2$. In addition to removing residual films from the walls of the chamber, this chemistry results in the displacement of chemical components, such as Br, that were adsorbed on the chamber walls. The removal of residual films and the displacement of chemical components leaves the chamber walls in a state that is far from the chemical equilibrium that is finally realized when the actual Cl— and/or Br— containing etch process is subsequently run.

Leaving the walls in a state that is far from the chemical equilibrium is not desirable because it changes the conditions of the plasma and consequently the eching parameters. In order to assure a controlled process, a stabilization procedure (conditioning/seasoning) is performed. It consists of etching several dummy wafers (usually 20 or more) using process conditions very similar to those that will be used when running product wafers. The goal is to stabilize the partial pressures of the gas components during subsequent production by bringing the chamber walls into an equilibrium state of adsorption and desorption of the species relevant to the process. This seasoning process has been monitored using a mass spectrometer (residual gas analyzer or RGA) to measure the partial pressure of the relevant molecular species. Data from the mass spectrometer has verified that approaching equilibrium in the partial pressures of various species usually requires a conditioning/seasoning step of 20 or more wafers lasting for more than 30 minutes.

These clean/conditioning processes use a significant amount of nonproductive tool time in addition to the cost of the process chemicals and wafers. Consequently, reduction of nonproductive tool time and these costs provides a significant opportunity for increasing the productivity of the new-generation high-density plasma low-pressure etch tools being used in semiconductor fabrication.

SUMMARY OF THE INVENTION

In accordance with the present invention, a method for conditioning a process chamber that employs adsorbing gases at low pressures is described comprising the steps of introducing a first gas into the chamber, soaking the chamber in the first gas at a pressure in the range from 10 mTorr. to 5 Torr., continuing the step of soaking until desorption from the walls of the process chamber of residual chemicals species such as molecules, molecular fragments and/or atoms and the adsorption of first components of the first gas such as molecules, molecular fragments and/or atoms reaches a saturation concentration on the walls.

BRIEF DESCRIPTION OF THE DRAWING

These and other features, objects, and advantages of the present invention will become apparent upon consideration of the following detailed description of the invention when read in conjunction with the drawing in which.

DESCRIPTION OF THE PREFERRED EMBODIMENTS

Figure 1A:
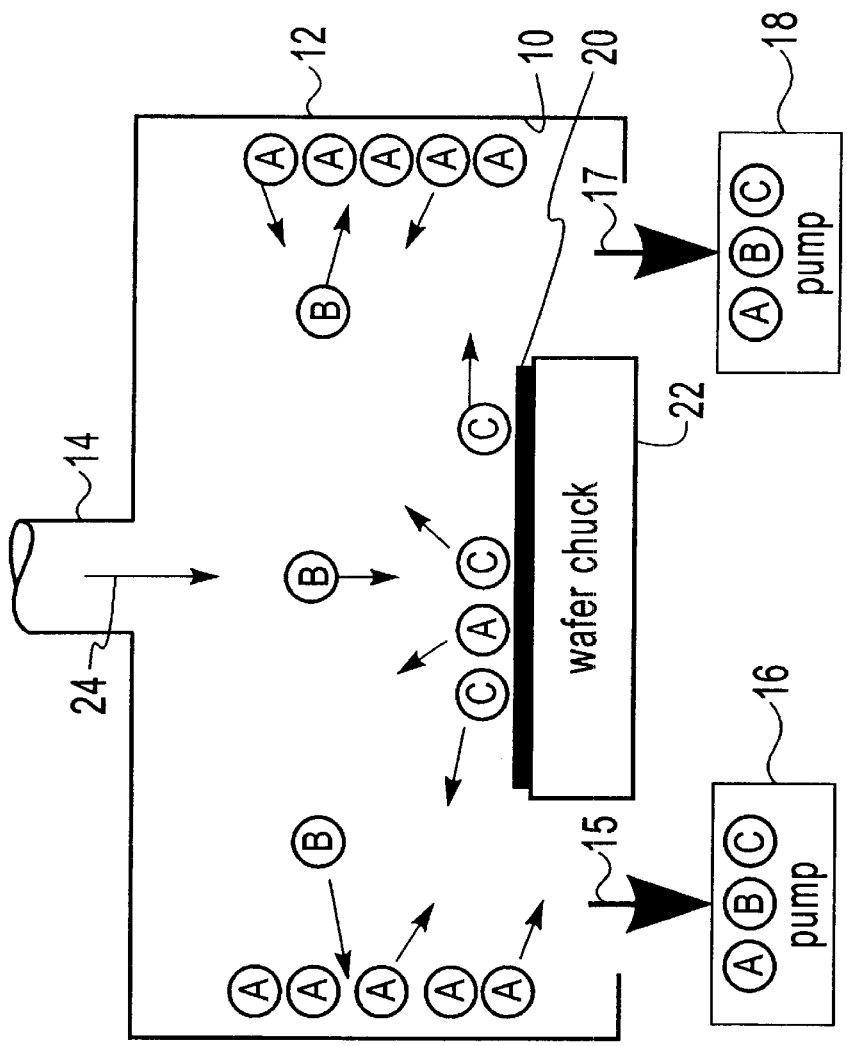
FIG. 1A is a schematic diagram of a chamber illustrating the beginning of a conditioning process of the prior art.

Referring now to the drawing, FIG. 1A shows a schematic diagram of chamber 12 illustrating the beginning condition of a conditioning process of the prior art. Chamber 12 may be used for etching or deposition such as chemical vapor deposition (CVD) and would be periodically cleaned and conditioned prior to resuming a respective process such as an etching process on product wafers.

Chamber 12 has a chamber or inside surface 10, and has an inlet 14 for admitting process gas species B shown by arrow 24. A workpiece 20 is positioned in chamber 12 on chuck 22. Pumps 16 and 18 maintain the pressure in chamber 12 and remove residual species A, process gas species B and etch product species C shown by arrows 15 and 17.

Prior to conditioning, the inside surface 10 of etch chamber 12 is partially covered by some residual species A left from the previous clean step. The conditioning process of the prior art usually uses one of the etching processes, which is usually operated at low pressure, typically in the range from 1 to 10 mTorr. Due to the low density of the process gas species B, and consequently its low collision and exchange rate with the residual species A on walls 10, it takes a relatively long time for the chamber wall 10 to reach an equilibrium concentration. Likewise, the etch product species C must equilibrate with the chamber wall 10, to the extent that concentration of the etch product species C on walls 10 affect the process chemistry.

Figure 1B:
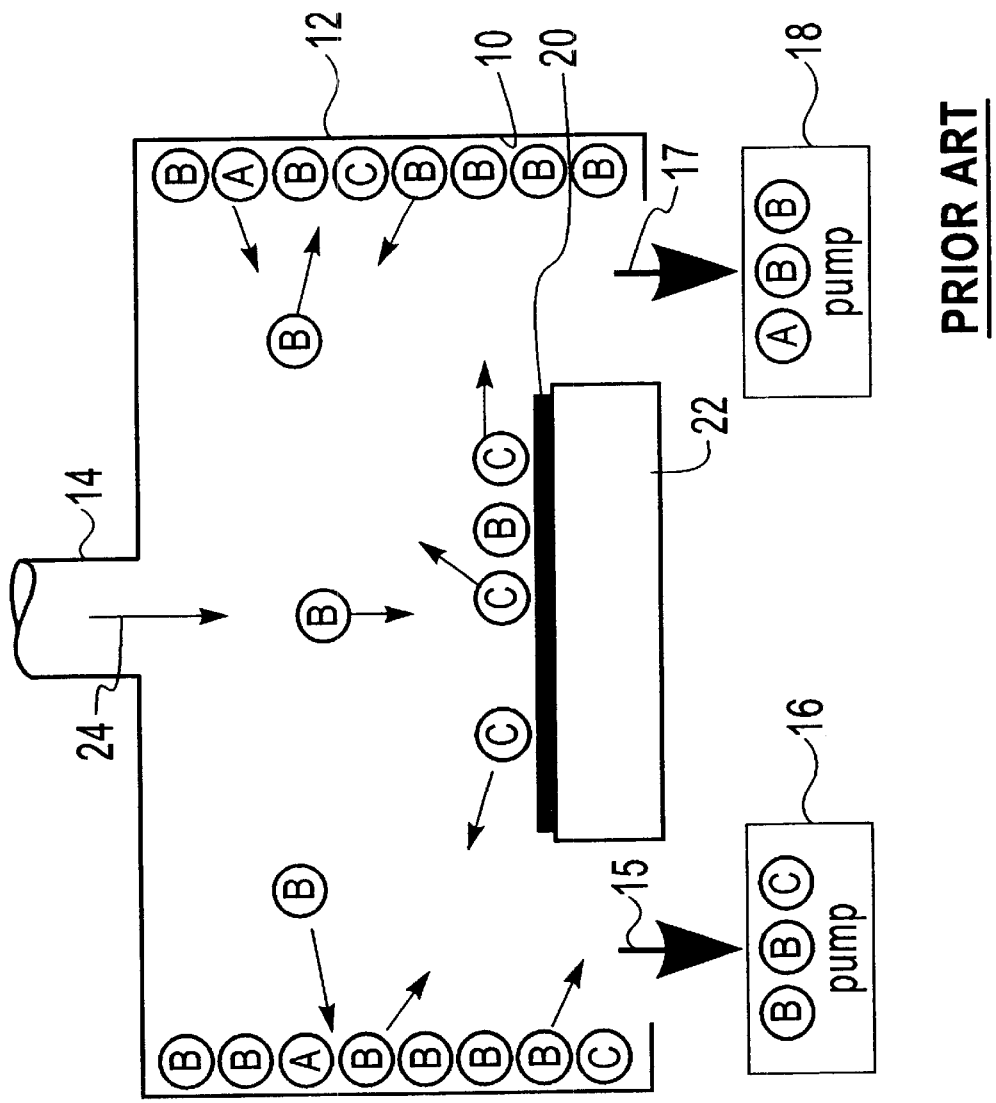
FIG. 1B is a schematic diagram of a chamber illustrating the end of a conditioning process of the prior art.

FIG. 1B is a schematic diagram illustrating species A, B and C at the end of the conditioning process of the prior art when species A, B and C are at equilibrium. Once the equilibrium concentration of the etch product species C on walls 10 is reached, the concentration of species in the plasma and the etch rate on the wafer become stable. An example of an etch product is $SiBr_x$ (where x=1,2,3, or 4).

Figure 2A:
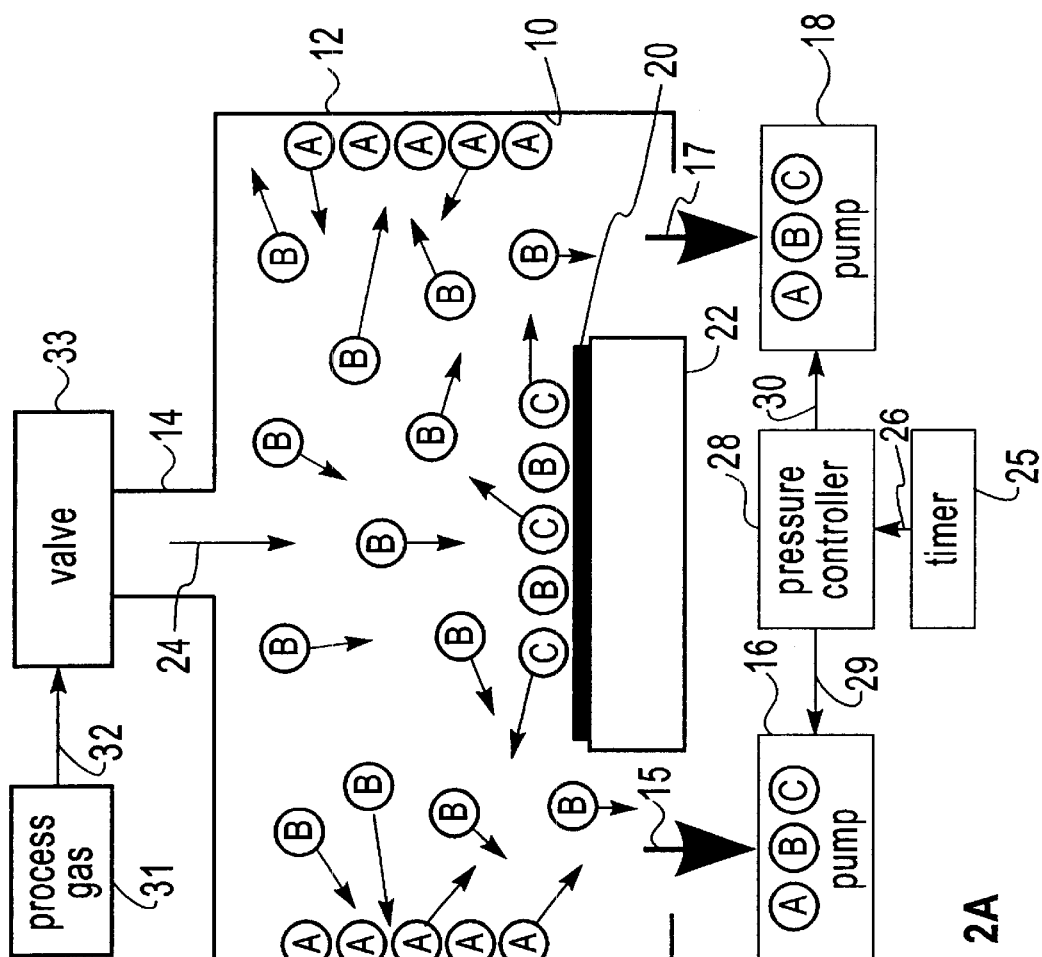
FIG. 2A is a schematic diagram of a chamber illustrating the beginning of a conditioning process of the present invention.
Figure 2B:
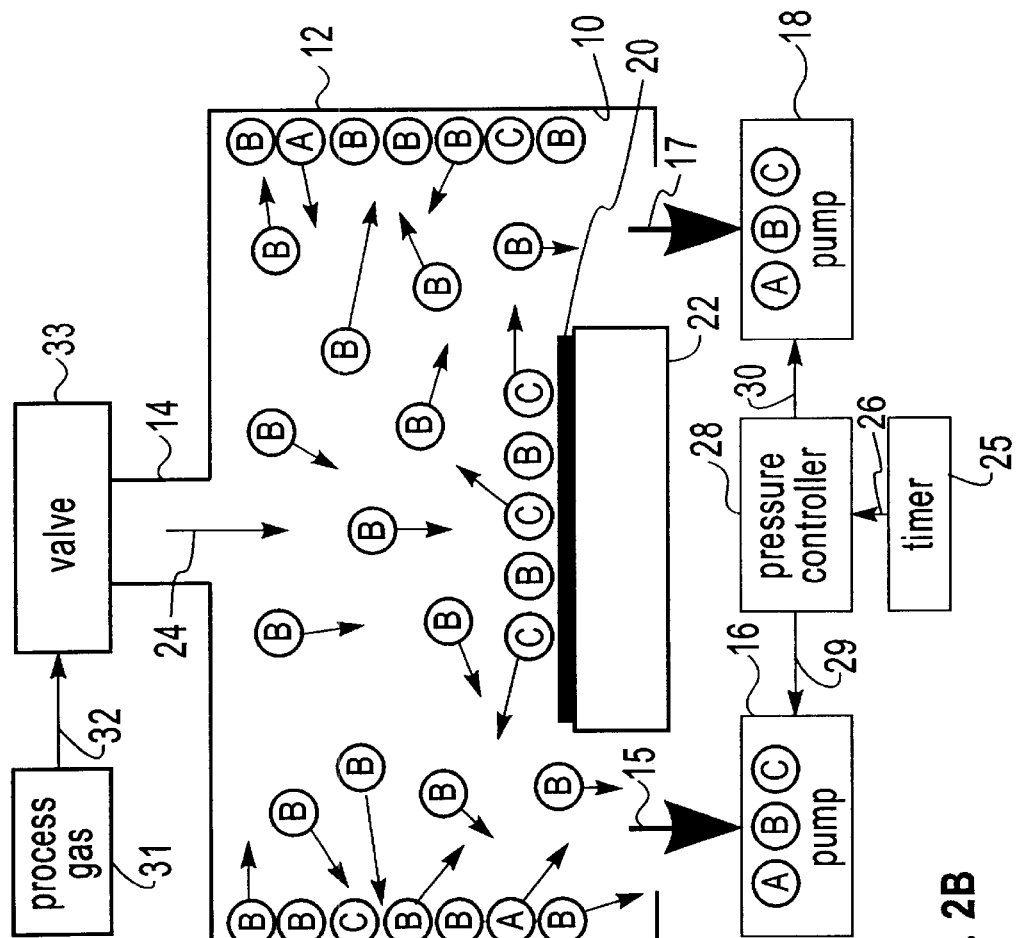
FIG. 2B is a schematic diagram of a chamber illustrating the end of a conditioning process of the present invention.

FIG. 2A shows a schematic diagram of chamber 12 illustrating the beginning condition of a conditioning process of the present invention. Chamber 12 has inside walls 10 and an inlet 14 which introduces process gas species B. Next, chamber 12 is soaked in process gas species B at a pressure in the range from 10 mTorr. to 5 Torr. FIGS. 2A and 2B show a timer 25 coupled over lead 26 to pressure controller 28 for providing the correct pressure for a period of time for soaking. Pressure controller 28 is coupled over leads 29 and 30 to pumps 16 and 18, respectively. Process gas B 31 may be coupled over duct 32 through valve 33 to inlet 14. Valve 31 may be controlled by pressure controller 28. Soaking is continued until desorption from the walls 10 of chamber 12 of residual chemical species A and the adsorption of first components of process gas, species B, reaches a saturation concentration on inside walls 10. A work piece 20 is introduced into chamber 12 and placed on chuck 22 which may be a wafer chuck. Process gas species B may be selected from the group consisting of Br, $Br_2$, HBr, $Cl_2$, HCl, $F_2$, $SiF_x$ and $NF_3$.

By utilizing a high pressure "soaking" process to increase the partial pressure of the reactant gas B and etch product species C on inside walls 10, a higher molecule-wall collision and exchange rate compared to the prior art will significantly reduce the time for chamber walls 10 to become repopulated with species B and C and to displace the residual species A. While the increased pressure may result in an equilibrium concentration of B on walls 10 that is higher than the equilibrium at process pressures, the desorption step may proceed much more rapidly than the collision/exchange-rate limited adsorption step.

FIG. 2B is a schematic diagram of chamber 12 illustrating species A, B and C on walls 10 at the end of a conditioning process. The increase in desorption rate over the prior art reduces the conditioning time and costs in a significant way, resulting in substantial savings in both non-productive tool time, wafer and gas usage.

In FIGS. 1B, 2A and 2B, like references are used for functions corresponding to the apparatus of FIG. 1A.

EXAMPLE 1

With reference to FIG. 2A, a Br-based process gas such as HBr was introduced through inlet 14 shown by arrow 24 into chamber 12 and permitted to soak in chamber 12 at a relatively high pressure, for example, from tens of mTorr to a few Torr until the desorption from the walls 10 of the residual chemicals, species A, which may be, for example, HCl, $Cl_2$, HF, etc . . . Species A may remain on walls 10 from the clean procedures. The adsorption of the process gas, species B, on walls 10, for example, HBr and $Br_2$, or etch products, species C, for example, $SiBr_x$ (where x=1, 2, 3 or 4) from the etching of silicon, reach a saturation concentration on walls 10, thus ensuring a situation near adsorption-desorption equilibrium during the etching process.

Figure 3:
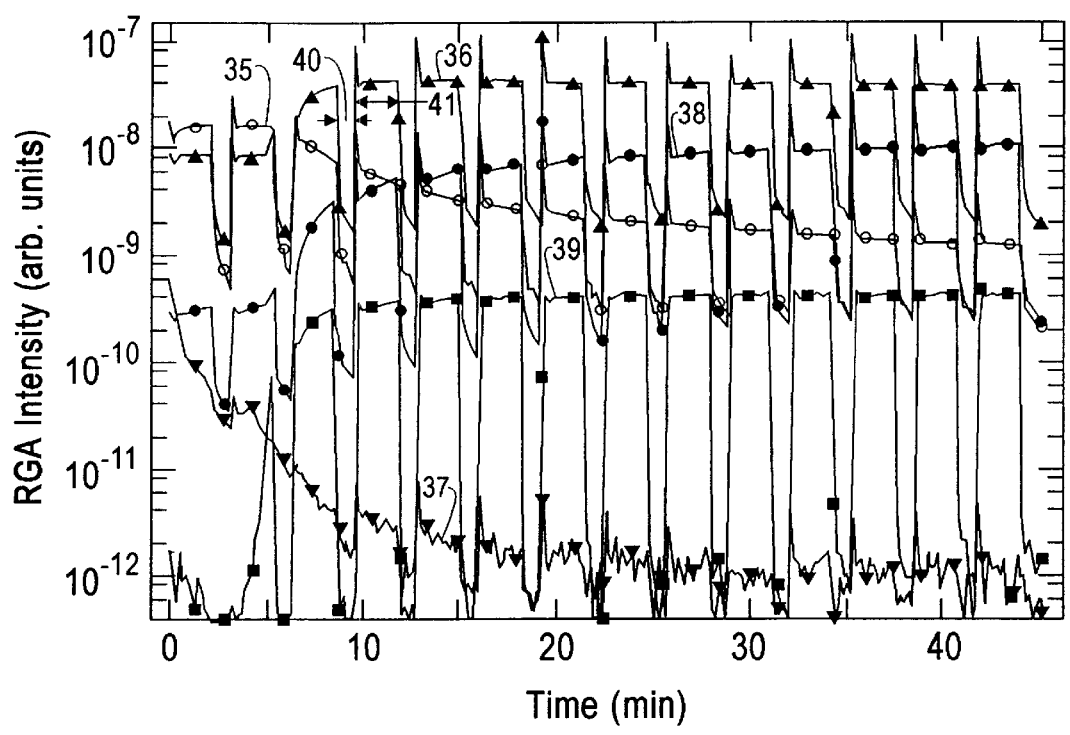
FIG. 3 is a graph showing curves of residual gas analyzer intensity versus time in a process of the prior art.

FIG. 3 is a graph showing curves 35–39 of residual gas analyzer (RGA) intensity versus time in a process of the prior art. In FIG. 3, the ordinate represents RGA intensity and the abscissa represents time. FIG. 3 shows the dynamics of several cycles of a standard chamber conditioning/seasoning procedure after a plasma chamber clean. Arrows 40 and 41 in FIG. 3 represent the time for one conditioning/seasoning cycle. Curves 35–39 show data from one of the new-generation, low-pressure, high-plasma-density etch tools. The standard plasma-clean procedure was done with $NF_3$ and $Cl_2$, during which the RGA was isolated. The conditioning was done with a silicon wafer and a pure HBr plasma. Curves 35–39 show data corresponding to HF, HCl, $Cl_2$, HBr, and SiBr, respectively. Curves 35–39 clearly show that it took about 5 to 10 conditioning/seasoning cycles or about 5 to 10 wafers before stable levels were reached as shown by the respective RGA curves for HF (20 amu, curve 35), HCl (36 amu, curve 36), $Cl_2$ (70 amu, curve 37) (both residual gases from the walls) Br (79 amu), HBr (80 amu, curve 38) (both from the process gas.), and SiBr (109 amu, curve 39) (one of the etch products) which reach stable levels.

Figure 4:
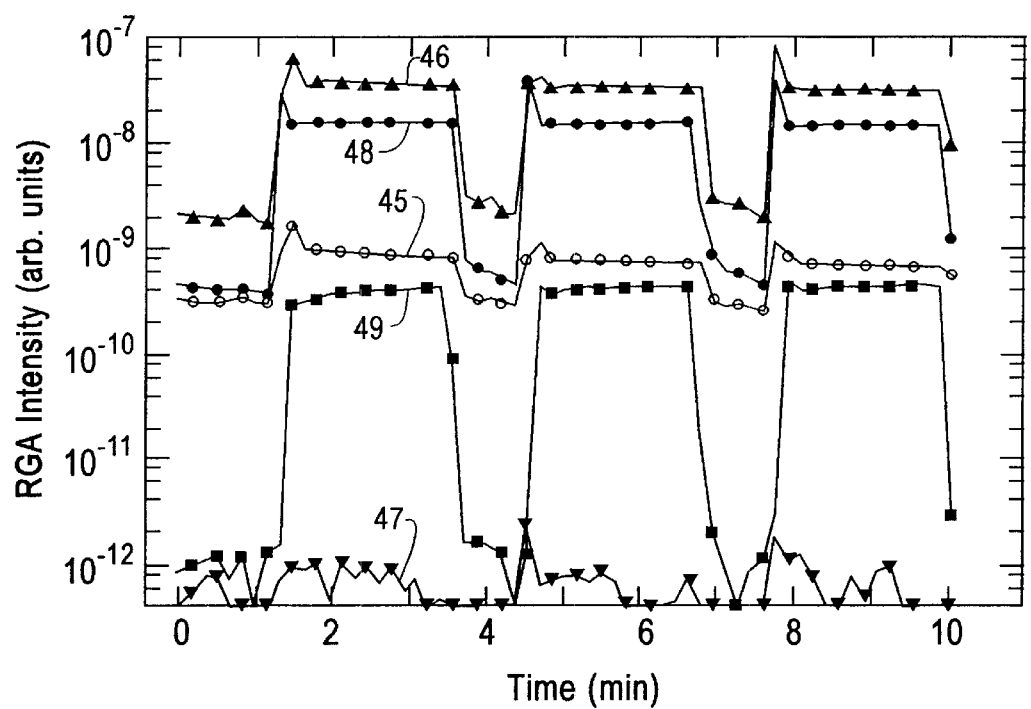
FIG. 4 is a graph showing curves of residual gas analyzer intensity versus time in a process of the present invention.
Figure 5:
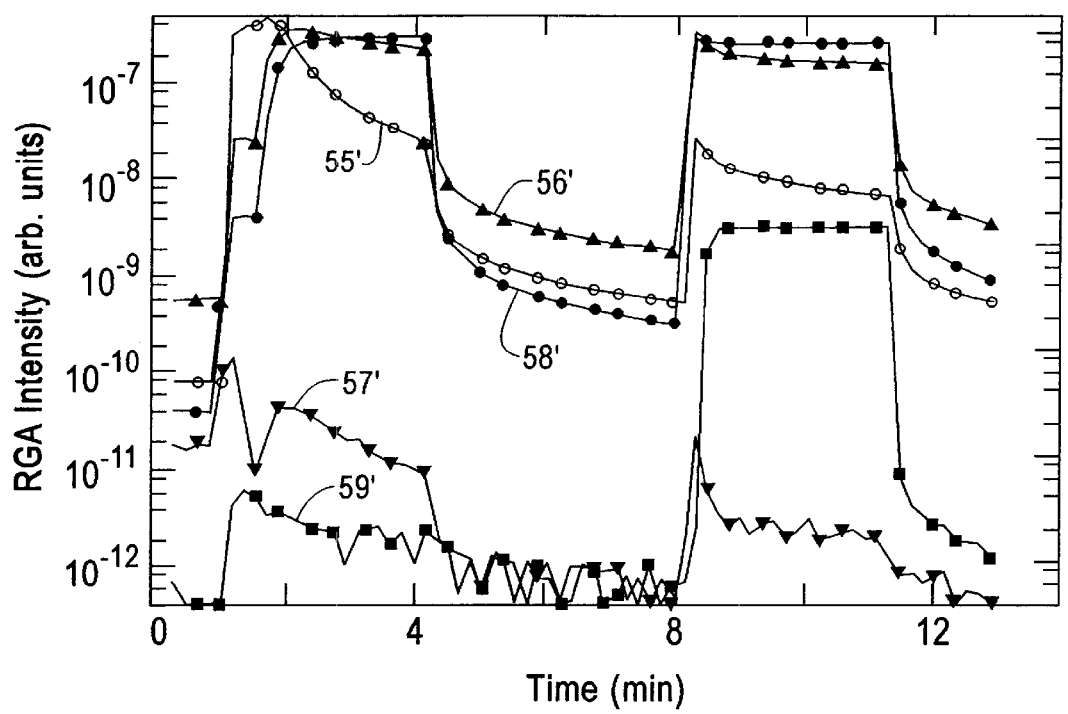
FIG. 5 is a graph showing curves of residual gas analyzer intensity versus time in a process of the present invention.

FIG. 4 is a graph showing curves 45–49 of residual gas analyzer intensity versus time in a process of the present invention. In FIG. 4, the ordinate represents RGA intensity and the abscissa represents time. FIG. 4 shows the effect of a chamber "soaking" step on the dynamics of the chamber 12 conditioning/seasoning step. After the same standard $NF_3/Cl_2$ clean procedure (with the RGA isolated), as in FIG. 3, chamber 12 was exposed to HBr at a relatively high pressure in the range from about 20 mTorr to about 5 Torr. This HBr soaking was monitored with a RGA. The data from the RGA is shown in FIG. 5. In FIG. 5, the ordinate represents RGA intensity and the abscissa represents time.

From the data from the RGA shown in FIG. 4, one can clearly see that after the "soaking" process, the residual species on wall 10 such as HF (20 amu, curve 45), HCl (36 amu, curve 46), $Cl_2$ (70 amu, curve 47), feed gas species such as Br (79 amu) and HBr (80 amu, curve 48), and etch product SiBr (109 amu, curve 49) were all stable after the first wafer.

The stability of respective molecular concentrations on walls 10 is shown by curves 55'–59' in FIG. 5. As shown in FIG. 5, stability was obtained between 8 and 12 minutes. Curves 55'–59' correspond to the same respective gas species as shown with curves 55–59.

While there has been described and illustrated a process for conditioning the inside walls 10 of chamber 10 by introducing a gas species and soaking the chamber for a period of time at inreased pressures, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A method for conditioning a process chamber that employs adsorbing gases at low pressures comprising the steps of:

introducing a first gas into said chamber, soaking said chamber in said first gas at a pressure in the range from 10 mTorr. to 5 Torr., continuing said step of soaking for a time period whereby desorption from the walls of said chamber of residual chemicals (species) and the adsorption of first components of said first gas reaches a saturation concentration on said walls, said step of continuing continues whereby there is substantially an adsorption-desorption equilibrium on the walls of said chamber corresponding to an equilibrium during a first process, and introducing a work piece into said chamber and performing said first process in said chamber employing a gas having said first components of said first gas therein.

2. The method of claim 1 wherein said first process is selected from the group consisting of etching and chemical vacuum deposition (CVD).

3. The method of claim 1 wherein said step of introducing includes the step of selecting said first gas having a first component of HBr.

4. The method of claim 3 wherein said residual chemicals result from including an earlier step of cleaning wherein said residual chemicals include at least one of HCl, $Cl_2$, HF and $NF_3$.

5. A method for conditioning a process chamber that employs adsorbing gases at low pressures comprising the steps of:

introducing a first gas into said chamber, said step of introducing including the step of selecting said first gas having a first component of HBr, soaking said chamber in said first gas at a pressure in the range from 10 mTorr. to 5 Torr., and continuing said step of soaking for a time period whereby desorption from the walls of said chamber of residual chemicals (species) and the adsorption of first components of said first gas reaches a saturation concentration on said walls.

6. The method of claim 5 wherein said residual chemicals result from including an earlier step of cleaning wherein said residual chemicals include at least one of HCl, $Cl_2$, HF and $NF_3$.

* * * * *